(12) United States Patent
Chen et al.

(10) Patent No.: US 7,381,623 B1
(45) Date of Patent: Jun. 3, 2008

(54) PRE-EPITAXIAL DISPOSABLE SPACER INTEGRATION SCHEME WITH VERY LOW TEMPERATURE SELECTIVE EPITAXY FOR ENHANCED DEVICE PERFORMANCE

(75) Inventors: Huajie Chen, Danbury, CT (US); Judson R. Holt, Wappingers Falls, NY (US); Kern Rim, Yorktown Heights, NY (US); Dominic J. Schepis, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/623,882

(22) Filed: Jan. 17, 2007

(51) Int. Cl.
*H01L 21/8234* (2006.01)
*H01L 21/336* (2006.01)
*H01L 21/331* (2006.01)
*H01L 21/36* (2006.01)

(52) U.S. Cl. .................. 438/300; 438/303; 438/305; 438/230; 438/151; 438/197; 438/595; 438/607; 438/478; 438/357; 257/E21.431; 257/E21.43; 257/E21.634; 257/E21.64

(58) Field of Classification Search ........... 438/300, 438/303, 305, 151, 197, 230, 595, 607, 478, 438/357; 257/E21.431, E21.43, E21.634, 257/E21.64
See application file for complete search history.

(56) References Cited

U.S. PATENT DOCUMENTS 6,902,980 B2 * 6/2005 Wang et al. ............. 438/305

2003/0011017 A1 * 1/2003 Lee et al. ................. 257/314
2005/0087824 A1   4/2005 Cabral, Jr. et al.
2005/0095799 A1 * 5/2005 Wang et al. ............. 438/303
2007/0128786 A1 * 6/2007 Cheng et al. ............ 438/199

* cited by examiner

*Primary Examiner*—Michael S. Lebentritt
*Assistant Examiner*—Mohsen Ahmadi
(74) *Attorney, Agent, or Firm*—Gibb & Rahman, LLC; Todd M. C. Li, Esq.

(57) ABSTRACT

The embodiments of the invention provide a method, etc. for a pre-epitaxial disposable spacer integration scheme with very low temperature selective epitaxy for enhanced device performance. More specifically, one method begins by forming a first gate and a second gate on a substrate. Next, an oxide layer is formed on the first and second gates; and, a nitride layer is formed on the oxide layer. Portions of the nitride layer proximate the first gate, portions of the oxide layer proximate the first gate, and portions of the substrate proximate the first gate are removed so as to form source and drain recesses proximate the first gate. Following this, the method removes remaining portions of the nitride layer, including exposing remaining portions of the oxide layer. The removal of the remaining portions of the nitride layer only exposes the remaining portions of the oxide layer and the source and drain recesses.

16 Claims, 14 Drawing Sheets

PRE-EPITAXIAL DISPOSABLE SPACER INTEGRATION SCHEME WITH VERY LOW TEMPERATURE SELECTIVE EPITAXY FOR ENHANCED DEVICE PERFORMANCE

BACKGROUND

1. Field of the Invention

The embodiments of the invention provide a method, etc. for a pre-epitaxial disposable spacer integration scheme with very low temperature selective epitaxy for enhanced device performance.

2. Description of the Related Art

For each successive microelectronics generation, the performance targets become harder to meet. One method for improving the device performance is so-called "Strained Silicon" where the channel region of the device is stressed by using selective epitaxy to regrow a straining material in the recessed source/drain region of the device. Two challenges are increasing the amount of strain in the channel by (for example) changing the composition of the epitaxial film and/or increasing the amount of activated dopant in the epitaxial film.

SUMMARY

The embodiments of the invention provide a method, etc. for a pre-epitaxial disposable spacer integration scheme with very low temperature selective epitaxy for enhanced device performance. More specifically, one method begins by forming a first gate and a second gate on a substrate. Next, an oxide layer is formed on the first gate, the second gate, and the substrate; and, a nitride layer is formed on the oxide layer. Portions of the nitride layer adjacent the first gate, portions of the oxide layer adjacent the first gate, and portions of the substrate adjacent the first gate are removed so as to form source and drain recesses adjacent the first gate. Following this, the method removes remaining portions of the nitride layer so as to expose remaining portions of the oxide layer. The removal of the remaining portions of the nitride layer only exposes the remaining portions of the oxide layer and the source and drain recesses.

Subsequently, the method precleans the remaining portions of the oxide layer and the source and drain recesses using a chemical composition that is selective only to oxide and silicon and is not selective to nitride. After the precleaning, the method epitaxially grows a strained material in the source and drain recesses using an epitaxial growth process that is selective to oxide. This grows the strained material on exposed portions of the substrate. After the remaining portions of the nitride layer are removed, exposed surfaces only include the remaining portions of the oxide layer and remaining portions of the substrate. The selective epitaxial growth process only grows the strained material on the remaining exposed portions of the substrate and not on the oxide. Moreover, the strained material is grown such that the strained material can contact the remaining portions of the oxide layer and remaining portions of the substrate. The epitaxial growth process does not affect the nitride layer because the nitride layer is absent.

Another method for a pre-epitaxial disposable spacer integration scheme begins by forming a substrate, comprising forming an oxide layer on a first silicon layer, and forming a second silicon layer on the oxide layer. The method then forms a first gate and a second gate over the substrate; and, forms first nitride spacers proximate the first gate and second nitride spacers proximate the second gate. Additionally, an oxide mask is formed on the substrate proximate the first nitride spacers, on the first nitride spacers, and over the first gate. The method also forms a cover over the oxide mask and forms oxide spacers on the second nitride spacers.

Subsequently, source and drain recesses are formed in the substrate proximate outer sidewalls of the oxide spacers. This involves removing upper portions of the second silicon layer such that bottom portions of the second silicon layer remain on the oxide layer. Next, the cover is removed and a strained material is epitaxially grown in the source and drain recesses using an epitaxial growth process that is selective to oxide. Furthermore, the method may epitaxially grow a second strained material on the strained material and pre-dope the first and second gates.

Accordingly, the embodiments of the invention provide an integration scheme where the nitride is removed just prior to selective epitaxial growth, which requires a precleaning process. The standard replacement source/drain integration schemes have both oxide and nitride exposed during selective epitaxial growth. However, there are multiple advantages to growing selective epitaxy when only oxide and silicon are present. First of all, a lower hydrochloric acid (HCL) flow may be employed, or the HCl gas may be removed entirely, giving a much higher epitaxial growth rate, or allowing for much lower temperature growth. Secondly, there is less loading effect, allowing for a more manufacturable process. Moreover, the morphology of the epitaxial film at the silicon/oxide interface is more predictable and more easily controlled when less HCl is used.

Thus, there are advantages of selective epitaxial growth when only oxide and silicon are exposed (as opposed to oxide, silicon, and nitride). Oxide loss should be kept to a minimum during the epitaxial preclean. Minimizing oxide loss is possible (for instance) using the chemical oxide removal (COR) preclean. However, COR processes are not effective when nitride is exposed because such processing removes too much of the nitride and damages the structure. In view of these problems, an integration scheme is provided here which results in a wafer with only oxide and/or silicon exposed prior to selective epitaxy (and prior to the preclean) with very little increased process complexity. Additionally, an exemplary process condition is given for in-situ B doped selective silicon germanium at 525 degrees Celsius (C) that allows for greatly increased activated B content and higher percent germanium.

These and other aspects of the embodiments of the invention will be better appreciated and understood when considered in conjunction with the following description and the accompanying drawings. It should be understood, however, that the following descriptions, while indicating preferred embodiments of the invention and numerous specific details thereof, are given by way of illustration and not of limitation. Many changes and modifications may be made within the scope of the embodiments of the invention without departing from the spirit thereof, and the embodiments of the invention include all such modifications.

BRIEF DESCRIPTION OF THE DRAWINGS

The embodiments of the invention will be better understood from the following detailed description with reference to the drawings, in which.

DETAILED DESCRIPTION OF PREFERRED EMBODIMENTS

Figure 1:
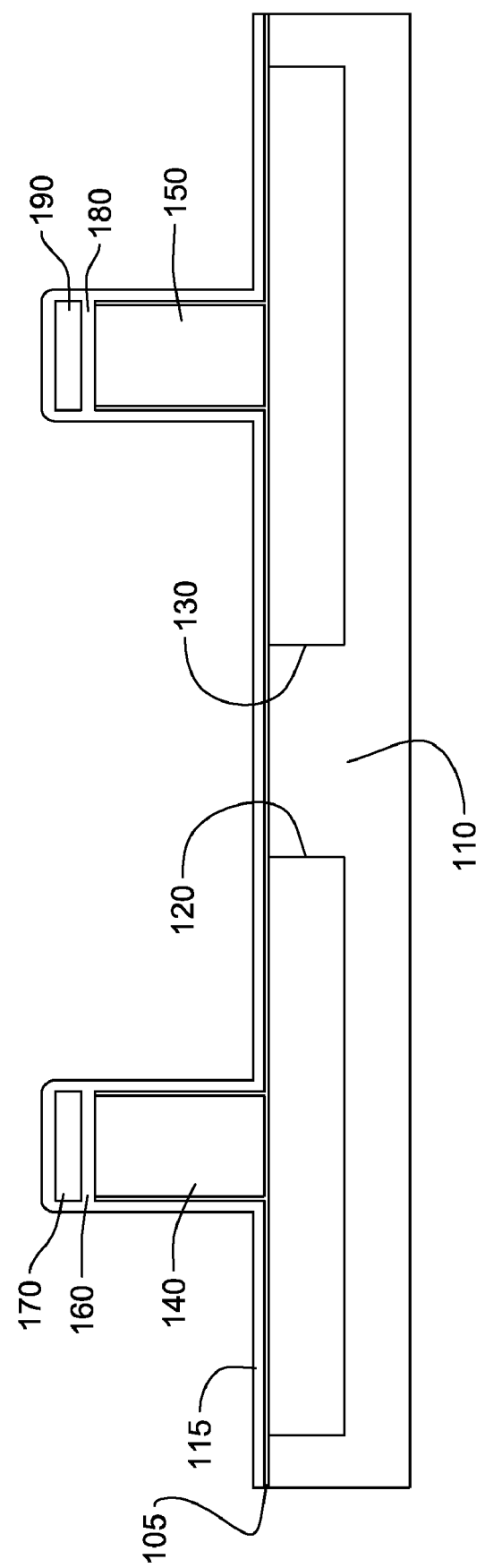
FIG. 1 is a diagram illustrating reoxidation and offset spacer deposition.

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention.

The embodiments of the invention provide an integration scheme where the nitride is removed just prior to selective epitaxial growth. The selective epitaxial growth requires a precleaning process. The standard replacement source/drain integration schemes have both oxide and nitride exposed during the precleaning and selective epitaxial growth. However, there are multiple advantages to growing selective epitaxy when only oxide and silicon are exposed and the nitride is covered. First of all, a lower hydrochloric acid (HCL) flow may be employed, or the HCl gas may be removed entirely, giving a much higher epitaxial growth rate, or allowing for much lower temperature growth. Secondly, there is less loading effect, allowing for a more manufacturable process. Moreover, the morphology of the epitaxial film at the silicon/oxide interface is more predictable and more easily controlled when less HCL is used.

Thus, there are advantages of selective epitaxial growth when only oxide is exposed (as opposed to both oxide and nitride). Oxide loss should be kept to a minimum during the epitaxial preclean. Minimizing oxide loss is possible (for instance) using the chemical oxide removal (COR) preclean. In view of these problems, an integration scheme is provided here which results in a wafer with only oxide or exposed silicon prior to selective epitaxy (and prior to the preclean) with very little increased process complexity. Additionally, an exemplary process condition is given for in-situ B doped selective silicon germanium at 525 degrees Celsius (C) that allows for greatly increased activated B content and higher percent germanium.

Referring to FIGS. 1-7, a method is illustrated for forming a semiconductor device 100. The method begins by patterning and etching polysilicon gate electrodes. Optionally, a nitride cap on an n-type field effect transistor (NFET) may be removed after gate re-oxidation. Poly re-oxidation oxide is grown; and, offset spacer material is deposited on the wafer.

More specifically, as illustrated in FIG. 1, a first transistor substrate region 120 and a second transistor substrate region 130 are formed in an upper portion of a substrate 110. It is contemplated that the substrate 110 could comprise a silicon on insulator substrate having an oxide layer on a first silicon layer and a second silicon layer on the oxide layer. A first gate 140 is formed on an upper middle portion of the first transistor substrate region 120; and, a second gate 150 is formed on an upper middle portion of the second transistor substrate region 130. A first silicon oxide cap layer 160 is formed on the first gate 140; and, a first silicon nitride cap layer 170 is formed on the first silicon oxide cap layer 160. Similarly, a second silicon oxide cap layer 180 is formed on the second gate 150; and, a second silicon nitride cap layer 190 is formed on the second silicon oxide cap layer 180.

Furthermore, a poly reoxidation oxide (thermal oxide) layer 105 is formed on the substrate 110, the first transistor substrate region 120, and the second transistor substrate region 130. The thermal oxide layer 105 is also formed on sidewalls of the first gate 140 and the second gate 150. An oxide layer 115 is formed over portions of the substrate 110, portions of the first transistor substrate region 120, and portions of the second transistor substrate region 130 that are not covered by the first gate 140 and the second gate 150. Sidewalls of the first silicon oxide cap layer 160 and the second silicon oxide cap layer 180, and sidewalls and top surfaces of the first silicon nitride cap layer 170 and the second silicon nitride cap layer 190 are also covered by the oxide layer 115. It is contemplated in an alternative embodiment that the oxide layer 115 could be replaced with a nitride layer. Details of similar processes are described in U.S. Patent Application Publication No. 20050087824 to Cabral, which is fully incorporated herein by reference.

Figure 2:
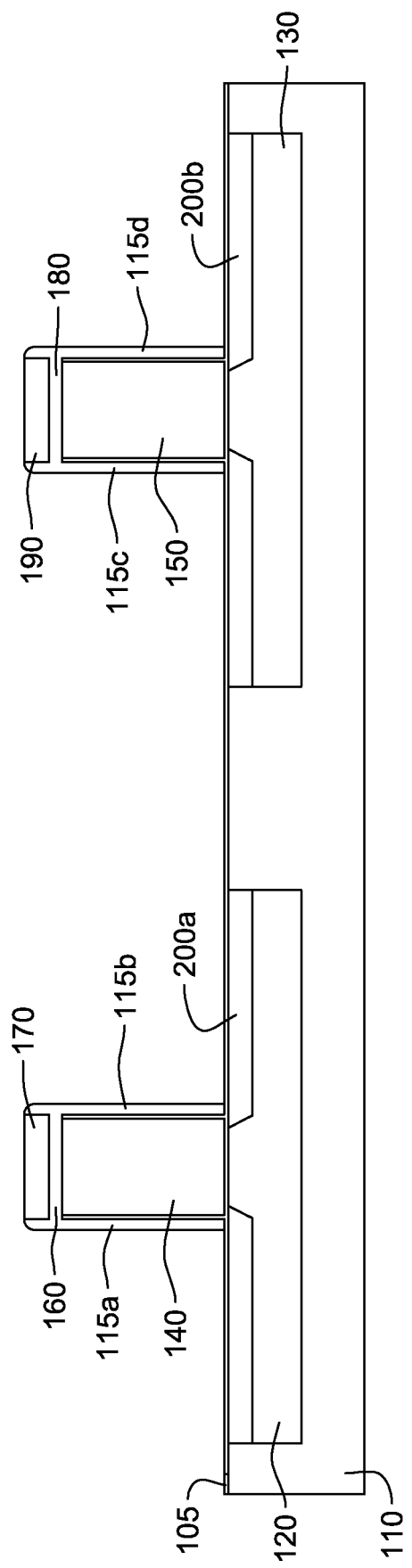
FIG. 2 is a diagram illustrating offset spacer etch and SDE implant.

Next, offset spacers are etched; and, extensions and halos are implanted. As illustrated in FIG. 2, the method removes portions of the oxide layer 115 that are not on portions of the thermal oxide layer 105 that contact the first gate 140 and the second gate 150, and portions of the oxide layer 115 that are not on sidewalls of the first silicon oxide cap layer 160, the second silicon oxide cap layer 180, the first silicon nitride cap layer 170, and the second silicon nitride cap layer 190. Thus, a spacer 115a is formed on first sidewalls of the first gate 140, the first silicon oxide cap layer 160, and the first silicon nitride cap layer 170. A spacer 115b is formed on second sidewalls of the first gate 140, the first silicon oxide cap layer 160, and the first silicon nitride cap layer 170, wherein the first gate 140 is between the spacer 115a and the spacer 115b. Similarly, a spacer 115c is formed on first sidewalls of the second gate 150, the second silicon oxide cap layer 180, and the second silicon nitride cap layer 190. A spacer 115d is formed on second sidewalls of the second gate 150, the second silicon oxide cap layer 180, and the second silicon nitride cap layer 190, wherein the second gate 150 is between the spacer 115c and the spacer 115d. Moreover, extensions and halos 200a and 200b are implanted into the first transistor substrate region 120 and the second transistor substrate region 130, respectively. Details of similar processes are described in U.S. Patent Application Publication No. 20050087824 to Cabral.

Following this, deposition of new liner and hardmask is performed. For exemplary purposes, only a nitride hardmask is illustrated, although it is contemplated that an oxide hardmask could be utilized. Patterning of silicon nitride hardmask is subsequently performed.

Figure 3:
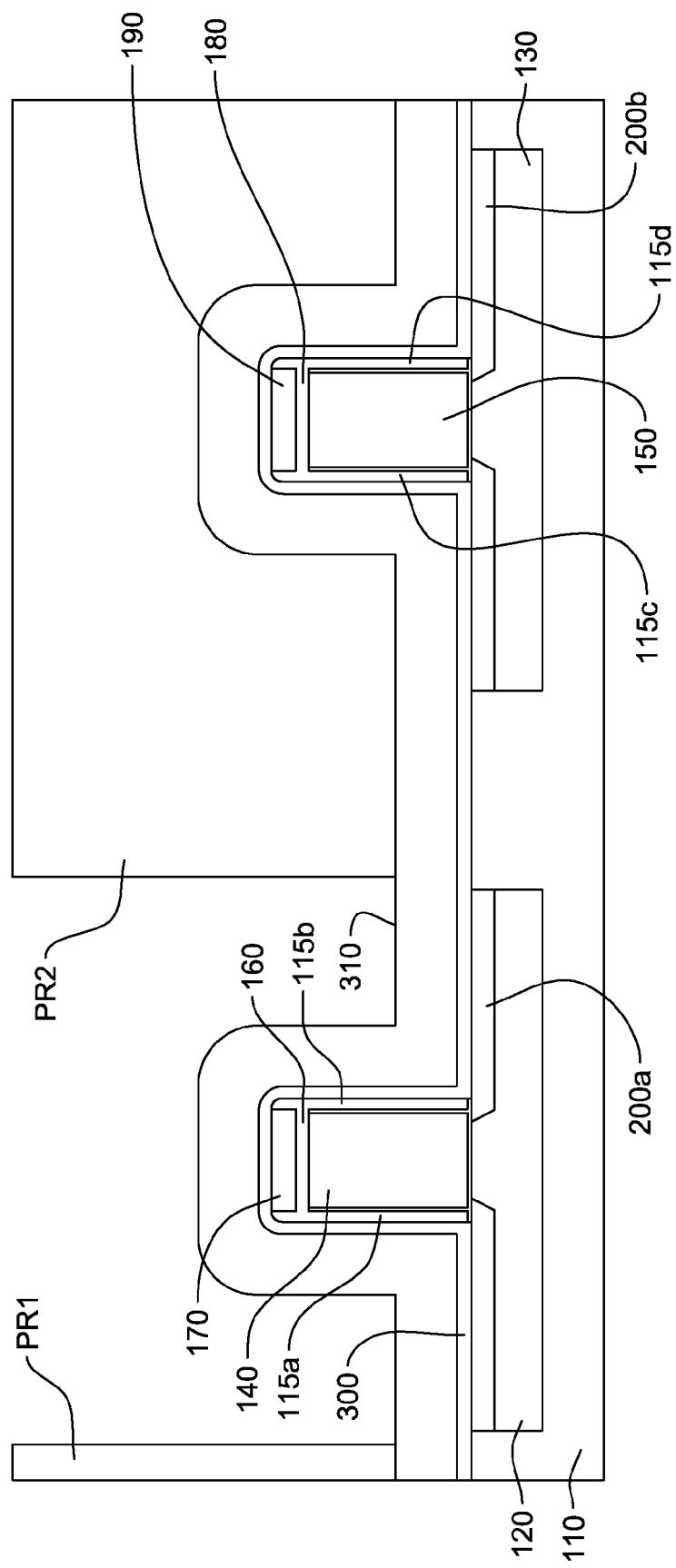
FIG. 3 is a diagram illustrating patterning of silicon nitride hardmask.

As illustrated in FIG. 3, uncovered portions of the thermal oxide layer 105 are removed; and, a liner oxide 300 is formed on uncovered portions of the substrate 110, the first transistor substrate region 120, and the second transistor substrate region 130. The liner oxide 300 is also formed on the spacers 115a, 115b, 115c, and 115d, the first silicon nitride cap layer 170, and the second silicon nitride cap layer 190. Additionally, a nitride hardmask 310 is formed on the liner oxide 300. Photoresists PR1 and PR2 are placed over portions of the nitride hardmask 310 that are not over the first transistor substrate region 120.

Subsequently, an etch of silicon nitride hardmask is performed, leaving spacers on sides of p-type field effect transistor (PFET) gate electrodes. The photoresists are stripped; and, a silicon etch is used to create a recess on the PFET. The nitride is removed selective to oxide. This is possible (for instance) using a hot phosphoric acid dip. Details of similar processes are described in U.S. Patent Application Publication No. 20050087824 to Cabral.

Figure 4:
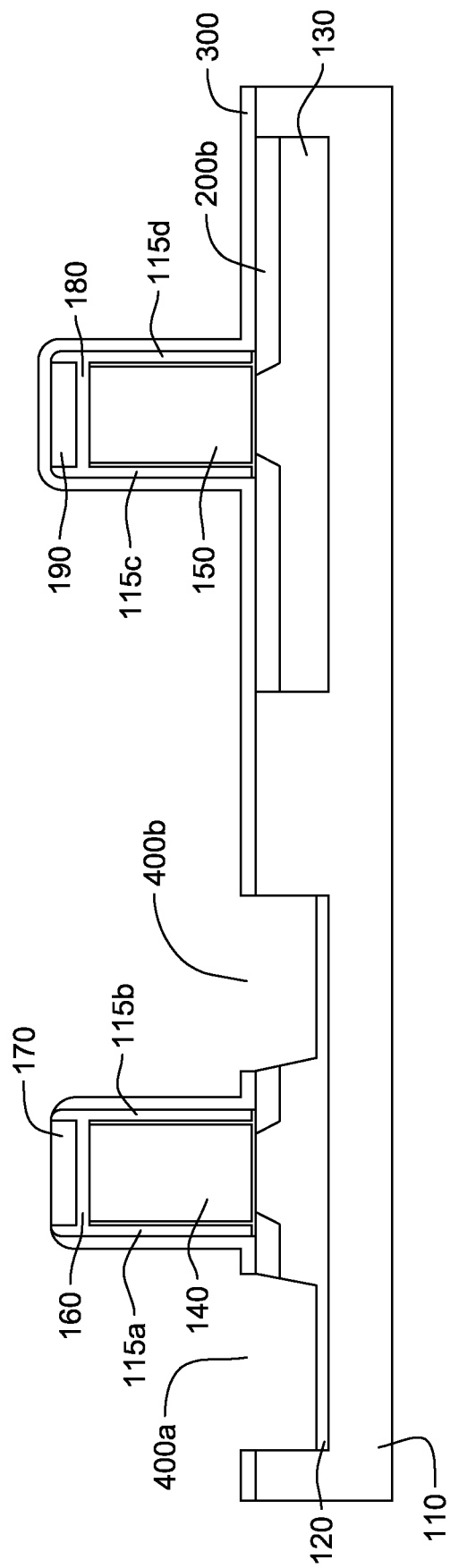
FIG. 4 is a diagram illustrating nitride removal and Si recess etch.

More specifically, as illustrated in FIG. 4, uncovered portions of the nitride hardmask 310 are removed. The method also removes the photoresists PR1 and PR2 and uncovered portions of the liner oxide 300. Portions of the first transistor substrate region 120 proximate outer walls of the spacers 115a and 115b are removed to create recesses 400a and 400b, respectively. This can be performed, for example, using reactive ion etching (RIE). The first silicon nitride cap layer 170 and remaining portions of the nitride hardmask 310 are also removed. Details of similar processes are described in U.S. Patent Application Publication No. 20050087824 to Cabral.

Figure 5:
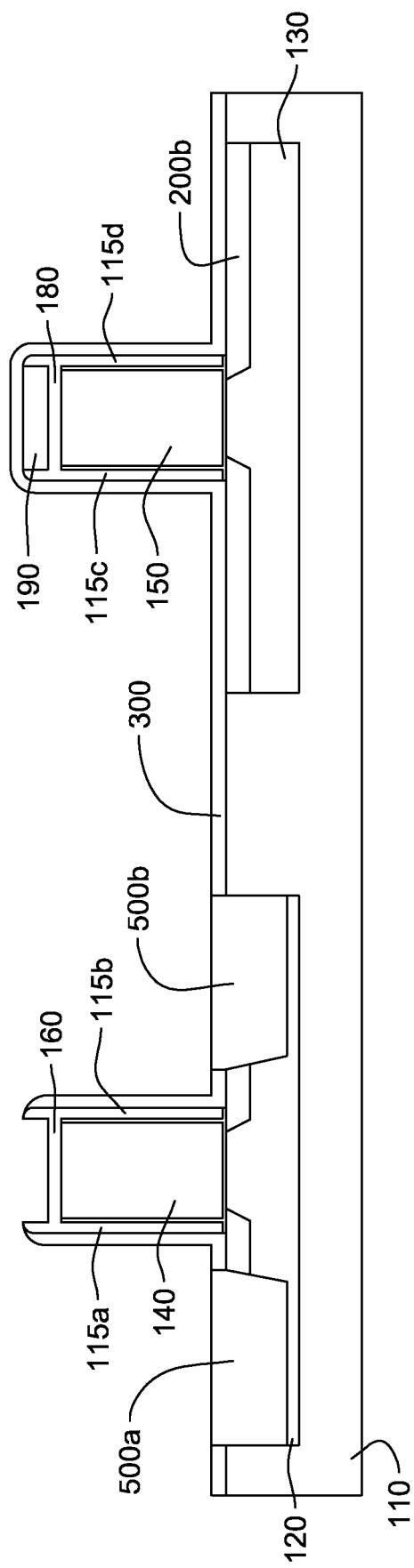
FIG. 5 is a diagram illustrating epitaxial growth.
Figure 6:
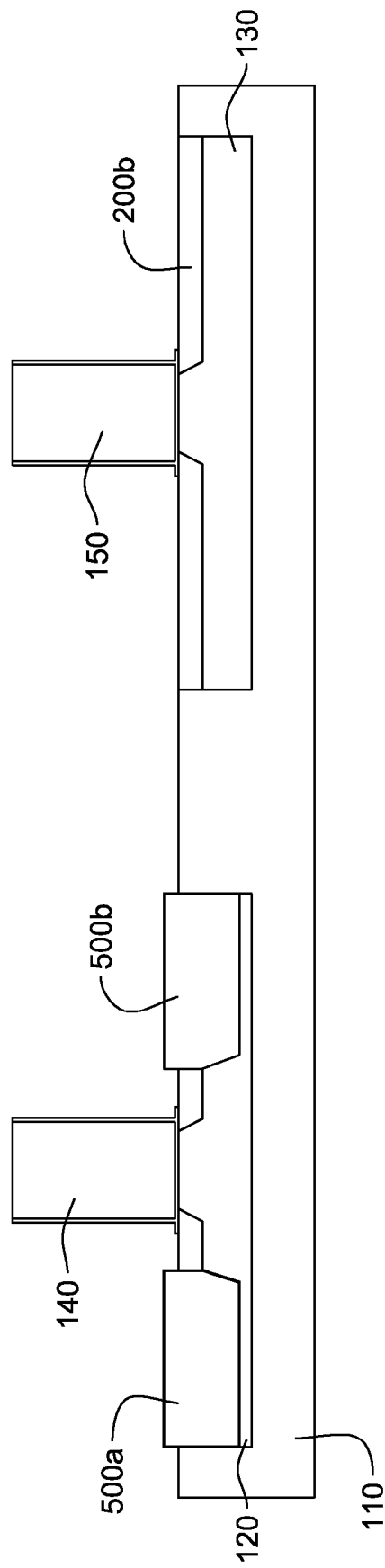
FIG. 6 is a diagram illustrating oxide removal, reoxidation, and nitride cap removal.

The oxide loss should be kept to a minimum during epitaxial preclean. This is possible (for instance) using COR for epitaxial preclean. As illustrated in FIG. 5, strained material 500a and 500b are epitaxially grown in the recesses 400a and 400b, respectively. The method then performs oxide removal, reoxidation, and nitride cap removal. More specifically, as illustrated in FIG. 6, the method removes the liner oxide 300, the second silicon nitride cap layer 190, the first silicon oxide cap layer 160, the second silicon oxide cap layer 180, and the spacers 115a, 115b, 115c, and 115d. Details of similar processes are described in U.S. Patent Application Publication No. 20050087824 to Cabral.

Figure 7:
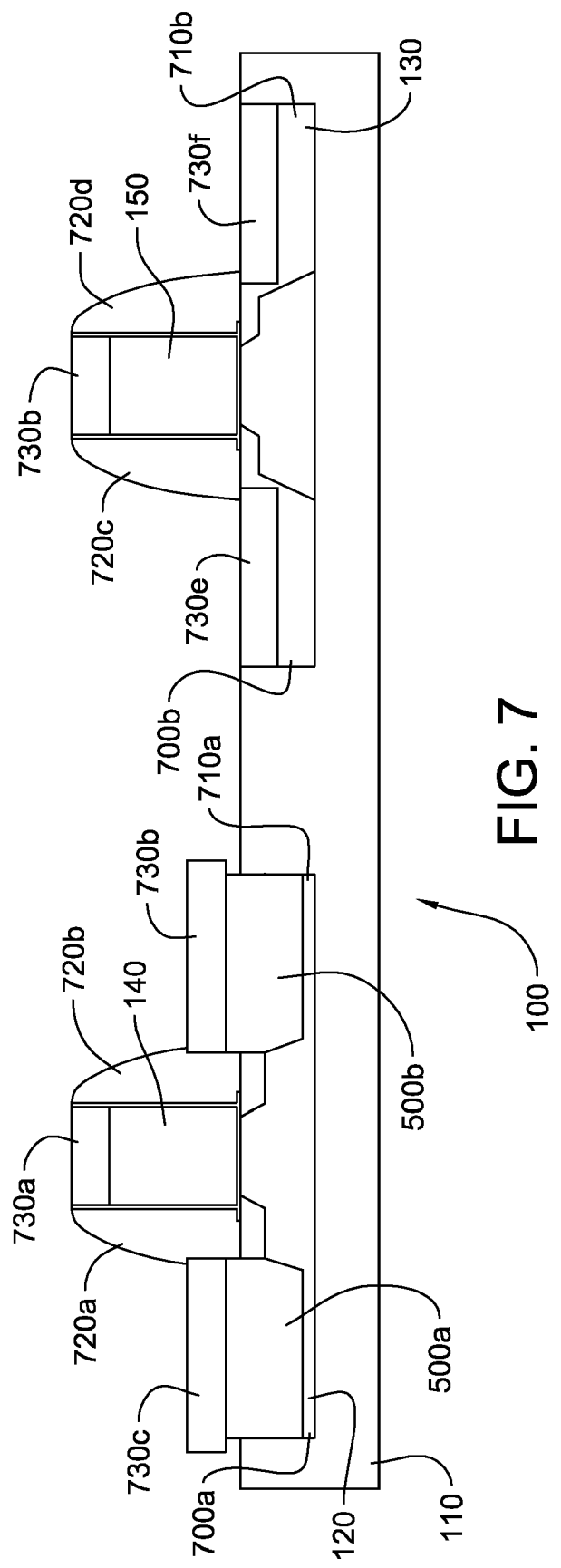
FIG. 7 is a diagram illustrating silicide formation.

As illustrated in FIG. 7, the method implants a source region 700a and a drain region 710a in outer portions of the first transistor substrate region 120. Similarly, a source region 700b and a drain region 710b are implanted in outer portions of the second transistor substrate region 130. Furthermore, spacers 720a and 720b are formed proximate the first gate 140, wherein the spacer 720a is between the first gate 140 and the strained material 500a, and wherein the spacer 720b is between the first gate 140 and the strained material 500b. Spacers 720c and 720d are also formed proximate the second gate 150, wherein the spacer 720c is between the second gate 150 and the source region 700b, and wherein the spacer 720b is between the second gate 150 and the drain region 710b. Subsequently, silicide members 730a and 730b are formed in upper portions of the first gate 140 and the second gate 150, respectively. Silicide members 730c, 730d, 730e, and 730f are formed over the source region 700a, the drain region 710a, the source region 700b, and the drain region 710b, respectively. As such, a first transistor 740 (also referred to herein as the "PFET") and a second transistor 750 (also referred to herein as the "NFET") are formed.

Referring now to FIGS. 8-14, a method is illustrated for forming a semiconductor device 800. Polysilicon patterning and etching, reoxidation and offset spacer deposition, offset spacer etching and halo/extension implantation are performed in a similar fashion as shown in FIGS. 1-2, above. In addition, PFET pre-doping is conducted as the gate is covered by thick oxide during the PFET source/drain (S/D) implant. Rapid thermal annealing (RTA) may be used after extension implant to reduce transient enhanced diffusion (TED). Oxide polysilicon (PC) hardmask is not removed after PC RIE by using COR for post-PC RIE clean, in order to cover the gate during epitaxy.

Figure 8:
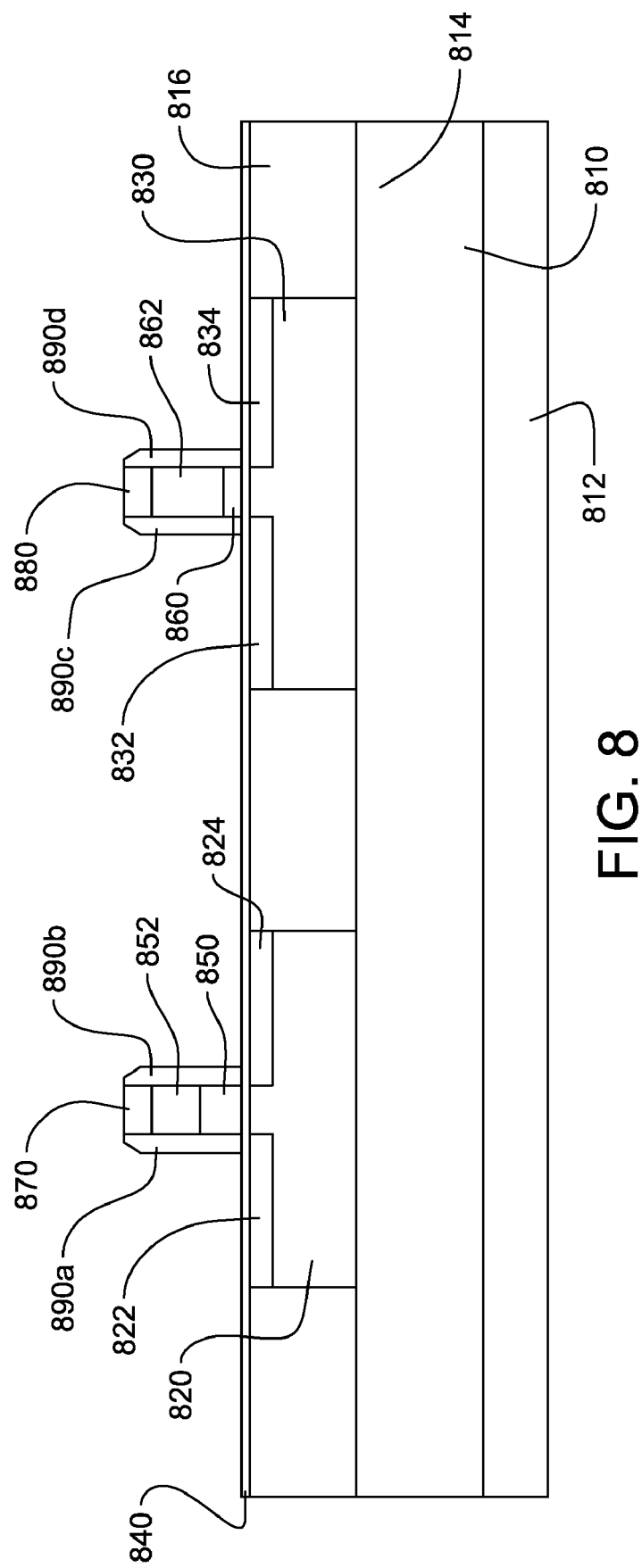
FIG. 8 is a diagram illustrating halo and extension implant.

More specifically, as illustrated in FIG. 8, a substrate 810 is formed including a first silicon layer 812, an oxide layer 814, and a second silicon layer 816. An NFET substrate region 820 and a PFET substrate region 830 are formed in portions of the second silicon layer 816. In addition, a first NFET implant region 822 and a second NFET implant region 824 are formed in upper left and right portions, respectively, of the NFET substrate region 820; and, a first PFET implant region 832 and a second PFET implant region 834 are formed in upper left and right portions, respectively, of the PFET substrate region 830. A thermal oxide layer 840 is formed on top surfaces of the second silicon layer 816, the NFET substrate region 820, the first NFET implant region 822, the second NFET implant region 824, the PFET substrate region 830, the first PFET implant region 832, and the second PFET implant region 834. Moreover, an NFET gate 850 is formed on the thermal oxide layer 840 between the first NFET implant region 822 and the second NFET implant region 824; and, a PFET gate 860 is formed on the thermal oxide layer 840 between the first PFET implant region 832 and the second PFET implant region 834. Upper portions of the gates 850 and 860 include gate pre-doping regions 852 and 862, respectively, wherein caps 870 and 880 are formed on the pre-doping regions 852 and 862, respectively. Further, spacers 890a and 890b are formed on first and second sidewalls, respectively, of the gate 850 and the cap 870; and, spacers 890c and 890d are formed on first and second sidewalls, respectively, of the gate 860 and the cap 880. Details of similar processes are described in U.S. Patent Application Publication No. 20050087824 to Cabral.

Figure 9:
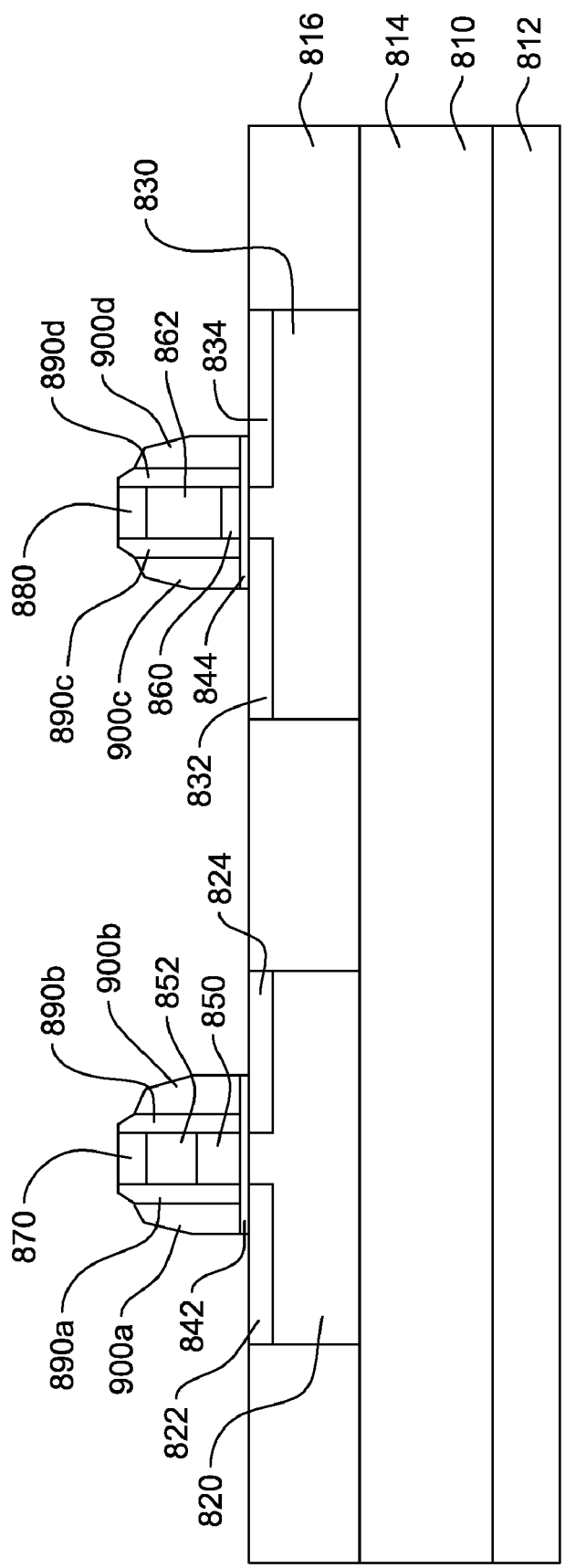
FIG. 9 is a diagram illustrating PFET spacer/NFET protection.

Next, nitride deposition and nitride spacer RIE is performed. As illustrated in FIG. 9, second spacers 900a and 900b are formed on opposite outer sidewalls of the spacers 890a and 890b, respectively; and, second spacers 900c and 900d are formed on opposite outer sidewalls of the spacers 890c and 890d, respectively. Portions of the thermal oxide layer 840 that are not covered by the second spacers 900a, 900b, 900c, and 900d; the spacers 890a, 890b, 890c, and 890d; and, the caps 870 and 880 are removed to create thermal oxide members 842 and 844. The thermal oxide member 842 is beneath the second spacers 900a and 900b, the spacers 890a and 890b and the gate 850; and, the thermal oxide member 844 is beneath the second spacers 900c and 900d, the spacers 890c and 890d, and the gate 860.

Following this, the method performs oxide deposition, lithography to cover NFETs, and oxide spacer RIE. This is compatible with dual spacer, with slight process flow modification. Oxide masking of nitride can be done after S/D anneal if integration scheme requires epitaxy after S/D anneal. PFET S/D implantation and silicon recess is also performed. The PFET S/D implantation can be with reduced dose or skipped; and, the silicon recess can be partially isotropic. Details of similar processes are described in U.S. Patent Application Publication No. 20050087824 to Cabral.

Figure 10:
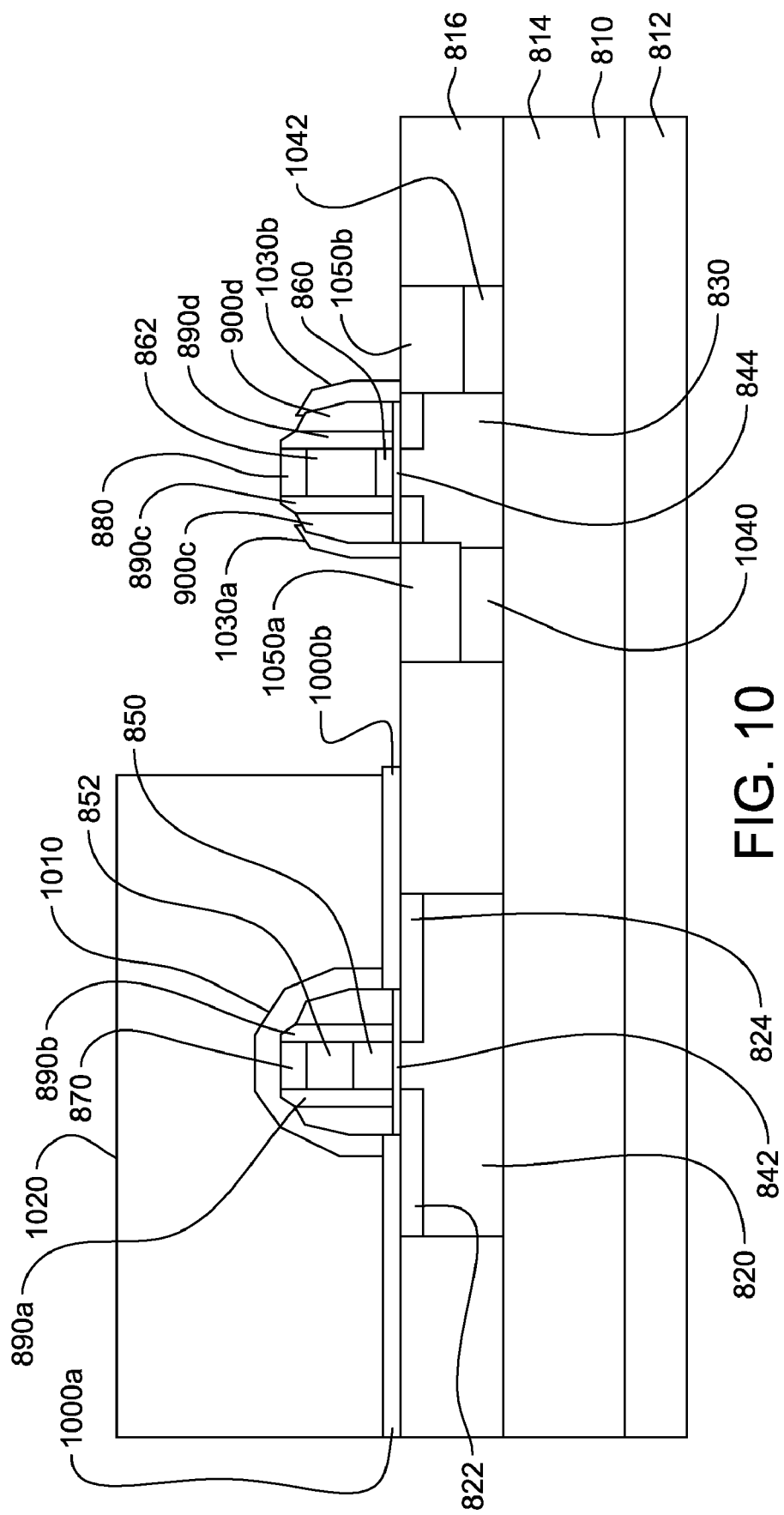
FIG. 10 is a diagram illustrating PFET S/D implant and recess.

Specifically, as illustrated in FIG. 10, oxide layers 1000a and 1000b are formed on opposite outer sidewalls of the thermal oxide member 842 and on lower portions of opposite outer sidewalls of the second spacers 900a and 900b, respectively. An NFET cover 1010 is formed on the cap 870, the spacers 890a and 890b, the second spacers 900a and 900b, and end portions of the oxide layers 1000a and 1000b that are proximate the thermal oxide member 842. Additionally, a resist 1020 is formed over the NFET cover 1010 and portions of the oxide layers 1000a and 1000b that are not covered by the NFET cover 1010.

PFET spacers 1030a and 1030b are formed on opposite outer sidewalls of the thermal oxide member 844 and on portions of opposite outer sidewalls of the second spacers 900c and 900d, respectively.

Furthermore, a source region 1040 and a drain region 1042 are formed in bottom left and right portions, respectively, of the PFET substrate region 830. Recesses 1050a and 1050b are formed over the source region 1040 and the drain region 1042, respectively. This involves removing portions of the PFET substrate region 830, the first PFET implant region 832, and the second PFET implant region 834 that are not under the thermal oxide member 844. Details of similar processes are described in U.S. Patent Application Publication No. 20050087824 to Cabral.

Figure 11:
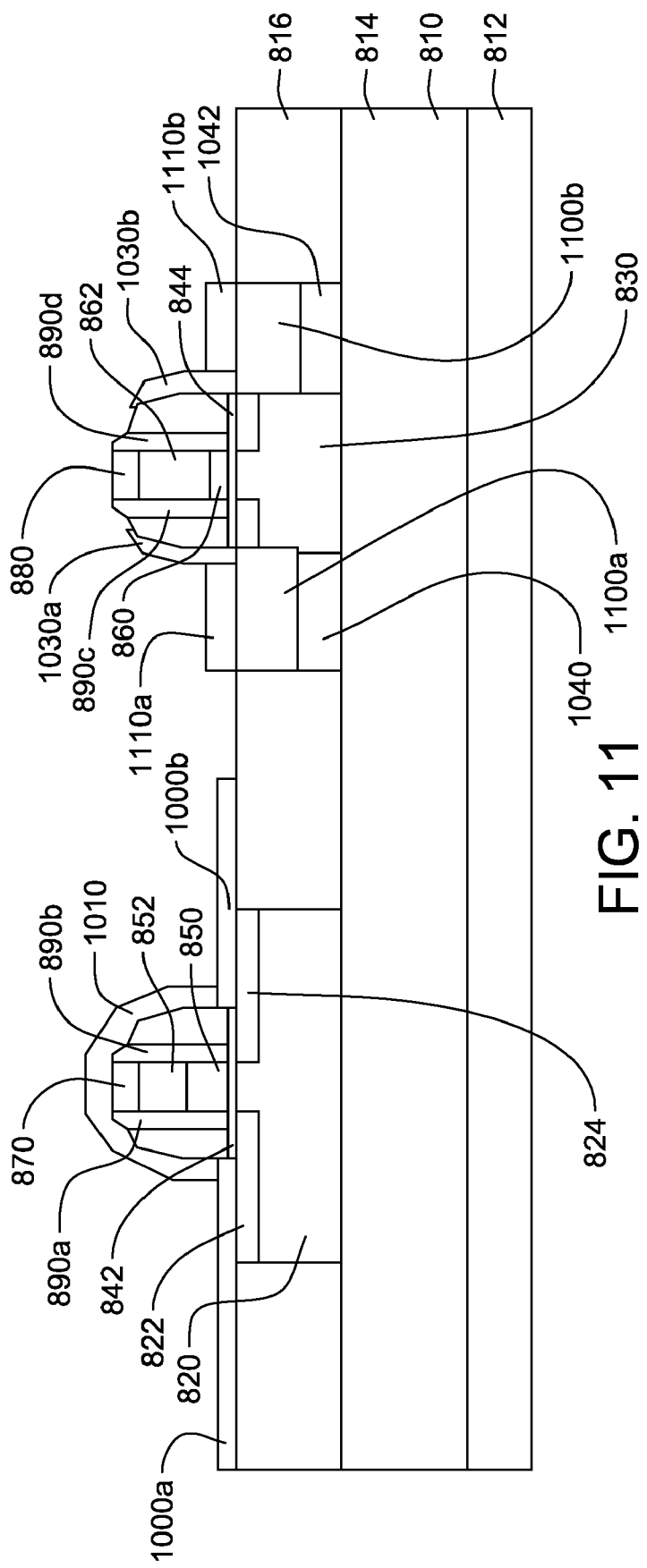
FIG. 11 is a diagram illustrating silicon germanium selective epitaxy.

Subsequently, the method performs a resist strip, clean, epitaxial preclean (for example COR), and silicon germanium (SiGe) selective epitaxy. As illustrated in FIG. 11, the resist 1020 is removed; and, strained material 1100a and 1100b are epitaxially grown in the recesses 1050a and 1050b, respectively. Strained material 1110a and 1110b are formed on portions of the strained material 1100a and 1100b, respectively, that are not covered by the PFET spacers 1030a and 1030b, wherein the strained material 1110a and 1110b contact opposite outer lower sidewalls of the PFET spacers 1030a and 1030b, respectively. The gate pre-doping regions 852 and 862 are extended downwards toward the thermal oxide members 842 and 844, respectively.

The method also performs oxide removal, NFET S/D implant, and S/D anneal. Additional spacer for NFET S/D implant is possible.

Figure 12:
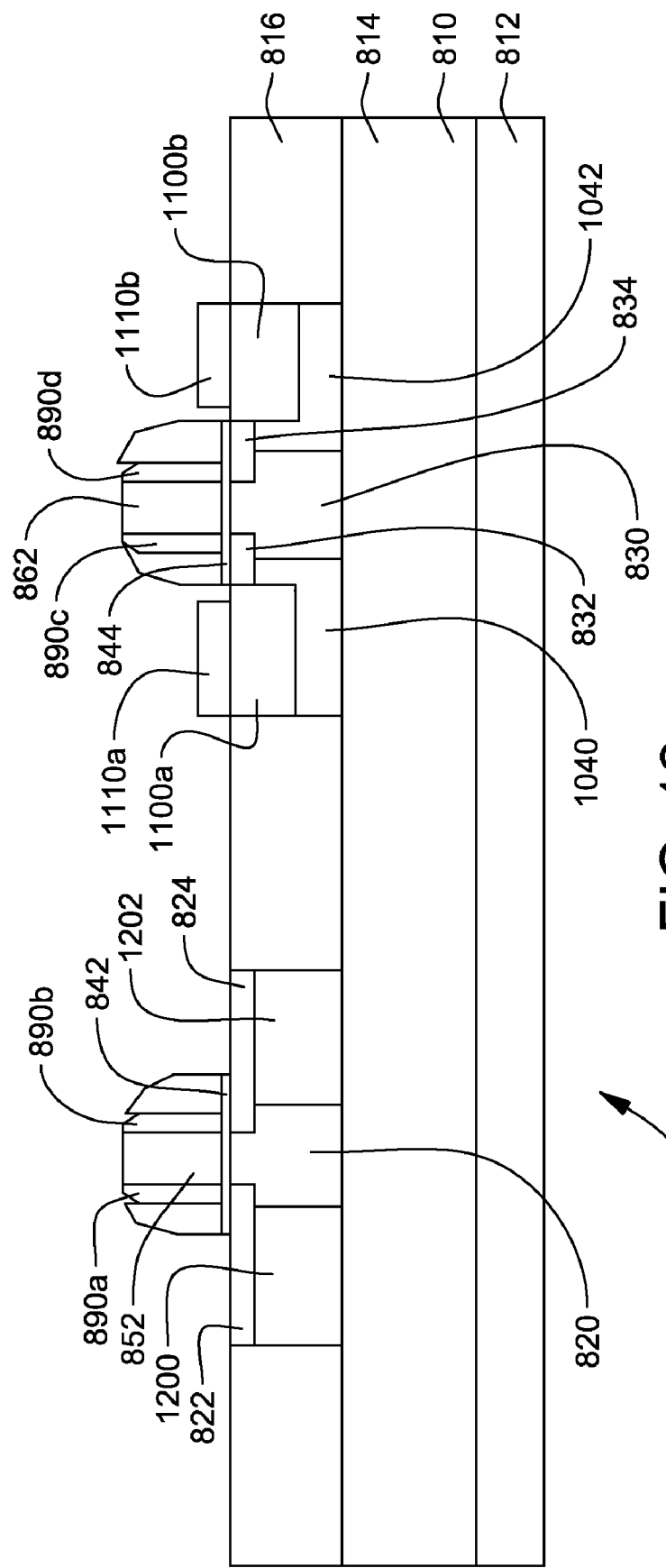
FIG. 12 is another diagram illustrating silicon germanium selective epitaxy.

More specifically, as illustrated in FIG. 12, the method removes the oxide layers 1000a and 1000b; the NFET cover 1010; the caps 870 and 880; upper portions of the spacers 890a, 890b, 890c, and 890d; upper portions of the second spacers 900a, 900b, 900c, and 900d; and, the PFET spacers 1030a and 1030b. The gate pre-doping regions 852 and 862 are extended downwards toward the thermal oxide members 842 and 844, respectively. In addition, the source region 1040 and the drain region 1042 of the PFET substrate region 830 are extended upwards along inner sidewalls of the strained material 1100a and 1100b until the source region 1040 and the drain region 1042 contact the first PFET implant region 832 and the second PFET implant region 834. A source region 1200 and a drain region 1202 are formed in left and right portions, respectively, of the NFET substrate region 820. As such, a bottom portion and a left sidewall of the source region 1200, and a bottom portion and a right sidewall of the drain region 1202, contacts the substrate 810.

Accordingly, the embodiments of the invention provide a method, etc. for a pre-epitaxial disposable spacer integration scheme with very low temperature selective epitaxy for enhanced device performance. More specifically, a method begins by forming a first gate and a second gate on a substrate. As described above, the method patterns and etches polysilicon gate electrodes. Optionally, a nitride cap on an NFET may be removed after gate re-oxidation. Next, an oxide layer (also referred to herein as the "liner oxide 300") is formed on the first and second gates; and, a nitride layer (also referred to herein as the "nitride hardmask 310") is formed on the oxide layer. As described above, deposition of new liner and hardmask is performed. For exemplary purposes, only a nitride hardmask is illustrated, although it is contemplated that an oxide hardmask could be utilized. Patterning of silicon nitride hardmask is subsequently performed.

Portions of the nitride layer proximate the first gate, portions of the oxide layer proximate the first gate, and portions of the substrate proximate the first gate are removed so as to form source and drain recesses (also referred to herein as the "recesses 400a and 400b") proximate the first gate. As described above, an etch of silicon nitride hardmask is performed, leaving spacers on sides of PFET gate electrodes. The photoresists are stripped; and, a silicon etch is used to create a recess on the PFET.

Following this, the method removes remaining portions of the nitride layer, including exposing remaining portions of the oxide layer. The removal of the remaining portions of the nitride layer only exposes the remaining portions of the oxide layer and the source and drain recesses. As described above, the nitride is removed selective to oxide. This is possible (for instance) using a hot phosphoric acid dip.

Subsequently, the method precleans the remaining portions of the oxide layer and the source and drain recesses using a chemical composition that is selective only to oxide and silicon and is not selective to nitride. After the precleaning, the method epitaxially grows a strained material in the source and drain recesses using an epitaxial growth process (which requires a precleaning process) that is selective to oxide. As described above, because the epitaxial growth is only selective to oxide, the oxide loss must be kept to a minimum during the epitaxial preclean. Minimizing oxide loss is possible (for instance) using COR for the epitaxial preclean.

The selective epitaxy grows the strained material on exposed portions of the substrate. After the remaining portions of the nitride layer are removed, exposed surfaces only include the remaining portions of the oxide layer and remaining portions of the substrate. The epitaxial growth process only grows the strained material on the remaining portions of the substrate. Moreover, the strained material is grown such that the strained material contacts the remaining portions of the oxide layer and remaining portions of the substrate. The epitaxial growth process does not affect the nitride layer because the nitride layer is absent.

Figure 13:
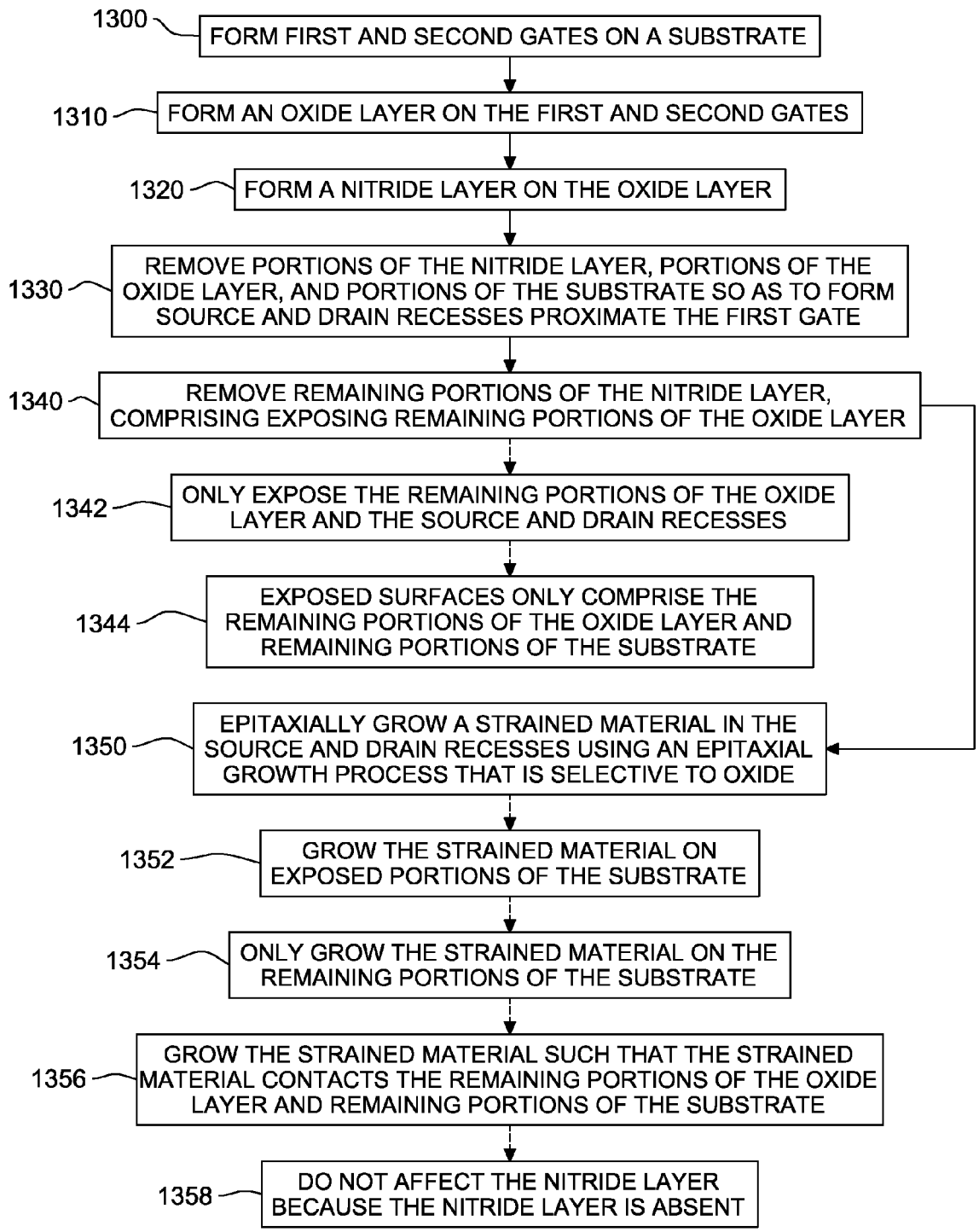
FIG. 13 is a flow diagram illustrating a method for a pre-epitaxial disposable spacer integration scheme.

Referring now to FIG. 13, a flow diagram of a method for a pre-epitaxial disposable spacer integration scheme is illustrated. The method begins in item 1300 by forming a first gate and a second gate on a substrate. As described above, the method patterns and etches polysilicon gate electrodes. Optionally, a nitride cap on an NFET may be removed after gate re-oxidation. Next, in item 1310, an oxide layer (also referred to herein as the "liner oxide 300") is formed on the first and second gates. In item 1320, a nitride layer (also referred to herein as the "nitride hardmask 310") is formed on the oxide layer. As described above, deposition of new liner and hardmask is performed. For exemplary purposes, only a nitride hardmask is illustrated, although it is contemplated that an oxide hardmask could be utilized. Patterning of silicon nitride hardmask is subsequently performed.

In item 1330, portions of the nitride layer proximate the first gate, portions of the oxide layer proximate the first gate, and portions of the substrate proximate the first gate are removed so as to form source and drain recesses (also referred to herein as the "recesses 400a and 400b") proximate the first gate. As described above, an etch of silicon nitride hardmask is performed, leaving spacers on sides of PFET gate electrodes. The photoresists are stripped; and, a silicon etch is used to create a recess on the PFET.

Following this, in item 1340, the method removes remaining portions of the nitride layer, including exposing remaining portions of the oxide layer. In item 1342, the removal of the remaining portions of the nitride layer only exposes the remaining portions of the oxide layer and the source and drain recesses. After the remaining portions of the nitride layer are removed, in item 1344, exposed surfaces only include the remaining portions of the oxide layer and remaining portions of the substrate. As described above, the nitride is removed selective to oxide. This is possible (for instance) using a hot phosphoric acid dip.

After removing the remaining portions of the nitride layer, in item 1350, the method epitaxially grows a strained material in the source and drain recesses using an epitaxial growth process (which requires a precleaning process) that is selective to oxide. Thus, as described above, the oxide loss should be kept to a minimum during the epitaxial preclean. Minimizing oxide loss is possible (for instance) using COR for the epitaxial preclean. In item 1352, the epitaxial growth process grows the strained material on exposed portions of the substrate. In item 1354, the epitaxial growth process only grows the strained material on the remaining portions of the substrate. Moreover, in item 1356, the strained material is grown such that the strained material contacts the remaining portions of the oxide layer and remaining portions of the substrate. In item 1358, the epitaxial growth process does not affect the nitride layer because the nitride layer is not exposed.

Figure 14:
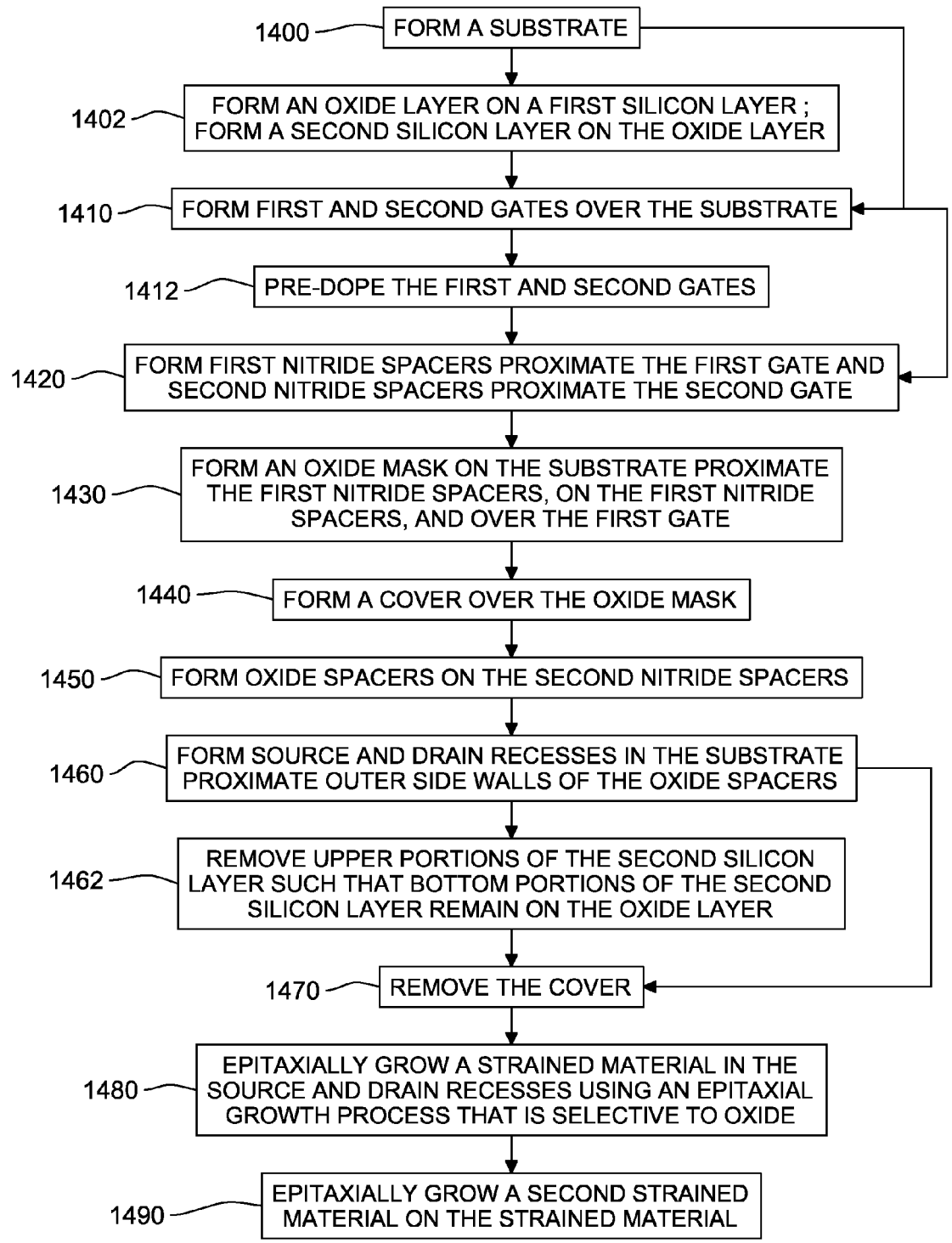
FIG. 14 is a flow diagram illustrating another method for a pre-epitaxial disposable spacer integration scheme.

Referring now to FIG. 14, a flow diagram of another method for a pre-epitaxial disposable spacer integration scheme is illustrated. The method begins in item 1400 by forming a substrate. This involves, in item 1402, forming an oxide layer on a first silicon layer, and forming a second silicon layer on the oxide layer. The method then forms, in item 1410, a first gate and a second gate over the substrate. In item 1412, the method pre-dopes the first and second gates. As also described above, PFET pre-doping is conducted as the gate is covered by thick oxide during the PFET S/D implant.

In item 1420, first nitride spacers are formed proximate the first gate and second nitride spacers are formed proximate the second gate. As described above, RTA may be used after extension implant to reduce TED. Oxide PC hardmask is not removed after PC RIE by using COR for post-PC RIE clean, in order to cover the gate during epitaxy.

Additionally, in item 1430, an oxide mask is formed on the substrate proximate the first nitride spacers, on the first nitride spacers, and over the first gate. The method also forms, in item 1440, a cover over the oxide mask. In item 1450, oxide spacers are formed on the second nitride spacers. As described above, this is compatible with dual spacer, with slight process flow modification. Oxide masking of nitride can be done after S/D anneal if integration scheme requires epitaxy after S/D anneal. It is contemplated that items 1430, 1440, and 1450 could be performed simultaneously.

Subsequently, in item 1460, source and drain recesses are formed in the substrate proximate outer sidewalls of the oxide spacers. This involves, in item 1462, removing upper portions of the second silicon layer such that bottom portions of the second silicon layer remain on the oxide layer. As described above, PFET S/D implantation and silicon recess is also performed. The PFET S/D implantation can be with reduced dose or skipped; and, the silicon recess can be partially isotropic.

Next, in item 1470, the cover is removed. In item 1480, a strained material is epitaxially grown in the source and drain recesses using an epitaxial growth process that is selective to oxide. As described above, the method performs a resist strip, clean, COR epitaxial preclean, and SiGe selective epitaxy. Furthermore, in item 1490, the method epitaxially grows a second strained material on the strained material.

Accordingly, the embodiments of the invention provide an integration scheme where the nitride is removed just prior to selective epitaxial growth. The selective epitaxial growth requires a precleaning process. The standard replacement source/drain integration schemes have both oxide and nitride exposed during the precleaning and selective epitaxial growth. However, there are multiple advantages to growing selective epitaxy when only oxide and silicon are exposed and the nitride is covered. First of all, a lower hydrochloric acid (HCL) flow may be employed, or the HCl gas may be removed entirely, giving a much higher epitaxial growth rate, or allowing for much lower temperature growth. Secondly, there is less loading effect, allowing for a more manufacturable process. Moreover, the morphology of the epitaxial film at the silicon/oxide interface is more predictable and more easily controlled when less HCL is used.

Thus, there are advantages of selective epitaxial growth when only oxide is exposed (as opposed to both oxide and nitride). Oxide loss should be kept to a minimum during the epitaxial preclean. Minimizing oxide loss is possible (for instance) using the chemical oxide removal (COR) preclean. In view of these problems, an integration scheme is provided here which results in a wafer with only oxide or exposed silicon prior to selective epitaxy (and prior to the preclean) with very little increased process complexity. Additionally, an exemplary process condition is given for in-situ B doped selective silicon germanium at 525 degrees Celsius (C) that allows for greatly increased activated B content and higher percent germanium.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments of the invention have been described in terms of preferred embodiments, those skilled in the art will recognize that the embodiments of the invention can be practiced with modification within the spirit and scope of the appended claims.

What is claimed is:

1. A method, comprising:

forming a first gate and a second gate on a substrate;

forming an oxide layer on said first gate, said second gate, and said substrate;

forming a nitride layer on said oxide layer;

removing portions of said nitride layer adjacent said first gate, portions of said oxide layer adjacent said first gate, and portions of said substrate adjacent said first gate, so as to form source and drain recesses adjacent said first gate;

removing remaining portions of said nitride layer so as to expose remaining portions of said oxide layer;

precleaning said remaining portions of said oxide layer and said source and drain recesses;

after said precleaning, epitaxially growing a strained material in said source and drain recesses using an epitaxial growth process that is selective to oxide; and prior to said forming of said first gate and said second gate, forming said substrate, comprising forming a buried oxide layer on a first silicon layer, and forming a second silicon layer on said buried oxide layer.

2. The method according to claim 1, wherein said precleaning comprises precleaning using a chemical composition that is selective only to oxide and silicon.

3. The method according to claim 1, wherein said removing of said remaining portions of said nitride layer only exposes said remaining portions of said oxide layer and said source and drain recesses.

4. The method according to claim 1, wherein said growing of said strained material comprises growing said strained material such that said strained material contacts said remaining portions of said oxide layer and remaining portions of said substrate.

5. The method according to claim 1, wherein said precleaning is not selective to nitride because said nitride layer is absent.

6. The method according to claim 1, wherein said precleaning comprises precleaning using a chemical composition that is not selective to nitride.

7. A method, comprising:

forming a first gate and a second gate on a substrate;

forming an oxide layer on said first gate, said second gate, and said substrate;

forming a nitride layer on said oxide layer;

removing portions of said nitride layer adjacent said first gate, portions of said oxide layer adjacent said first gate, and portions of said substrate adjacent said first gate, so as to form source and drain recesses adjacent said first gate;

removing remaining portions of said nitride layer so as to expose remaining portions of said oxide layer;

precleaning said remaining portions of said oxide layer and said source and drain recesses using a chemical composition that is selective only to oxide and silicon;

after said precleaning, epitaxially growing a strained material in said source and drain recesses using an epitaxial growth process that is selective to oxide; and prior to said forming of said first gate and said second gate, forming said substrate, comprising forming a buried oxide layer on a first silicon layer, and forming a second silicon layer on said buried oxide layer.

8. The method according to claim 7, wherein said precleaning comprises precleaning using a chemical composition that is not selective to nitride.

9. The method according to claim 7, wherein said removing of said remaining portions of said nitride layer only exposes said remaining portions of said oxide layer and said source and drain recesses.

10. The method according to claim 7, wherein said growing of said strained material comprises growing said strained material such that said strained material contacts said remaining portions of said oxide layer and remaining portions of said substrate.

11. The method according to claim 7, wherein said epitaxial growth process does not affect said nitride layer because said nitride layer is absent.

12. A method, comprising:

forming a substrate;

forming a first gate and a second gate over said substrate;

forming first nitride spacers proximate said first gate and second nitride spacers proximate said second gate;

forming an oxide mask on said substrate proximate said first nitride spacers, on said first nitride spacers, and over said first gate;

forming a cover over said oxide mask;

forming oxide spacers on said second nitride spacers;

forming source and drain recesses in said substrate proximate outer sidewalls of said oxide spacers;

removing said cover;

epitaxially growing a strained material in said source and drain recesses using an epitaxial growth process that is selective to oxide; and pre-doping said first gate and a second gate.

13. The method according to claim 12, wherein said forming of said substrate comprises forming an oxide layer on a first silicon layer, and forming a second silicon layer on said oxide layer.

14. The method according to claim 12, wherein said forming of said source and drain recesses comprises removing upper portions of said second silicon layer such that bottom portions of said second silicon layer remain on said oxide layer.

15. A method, comprising:

forming a substrate, comprising forming an oxide layer on a first silicon layer, and forming a second silicon layer on said oxide layer;

forming a first gate and a second gate over said substrate;

forming first nitride spacers on said first gate and second nitride spacers on said second gate;

forming an oxide mask on said substrate proximate said first nitride spacers, on said first nitride spacers, and over said first gate;

forming a cover over said oxide mask;

forming oxide spacers on said second nitride spacers;

forming source and drain recesses in said substrate proximate outer sidewalls of said oxide spacers;

removing said cover;

epitaxially growing a strained material in said source and drain recesses using an epitaxial growth process that is selective to oxide; and pre-doping said first gate and a second gate.

16. The method according to claim 15, wherein said forming of said source and drain recesses comprises removing upper portions of said second silicon layer such that bottom portions of said second silicon layer remain on said oxide layer.

* * * * *